(12) United States Patent
Shindo et al.

(10) Patent No.: US 7,510,635 B2
(45) Date of Patent: Mar. 31, 2009

(54) HIGH PURITY ZINC OXIDE POWDER AND METHOD FOR PRODUCTION THEREOF, AND HIGH PURITY ZINC OXIDE TARGET AND THIN FILM OF HIGH PURITY ZINC OXIDE

(75) Inventors: Yuichiro Shindo, Ibaraki (JP); Kouichi Takemoto, Ibaraki (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 438 days.

(21) Appl. No.: 10/572,328

(22) PCT Filed: Sep. 8, 2004

(86) PCT No.: PCT/JP2004/013031

§ 371 (c)(1),
(2), (4) Date: Mar. 17, 2006

(87) PCT Pub. No.: WO2005/033355

PCT Pub. Date: Apr. 14, 2005

(65) Prior Publication Data

US 2007/0098626 A1    May 3, 2007

(30) Foreign Application Priority Data

Sep. 30, 2003  (JP) ............................. 2003-339317

(51) Int. Cl.
*C01G 9/02* (2006.01)
(52) U.S. Cl. .................. 204/298.13; 423/622
(58) Field of Classification Search .............. 423/99, 423/100, 101, 104, 109, 622; 204/298.13
See application file for complete search history.

(56) References Cited

U.S. PATENT DOCUMENTS

| | | | | |
|---|---|---|---|---|
| 4,572,771 | A * | 2/1986 | Duyvesteyn et al. | 205/606 |
| 4,610,722 | A * | 9/1986 | Duyvesteyn et al. | 75/724 |
| 5,527,519 | A | 6/1996 | Miksits et al. | |
| 6,338,748 | B1 * | 1/2002 | Lee et al. | 75/725 |
| 6,361,753 | B1 * | 3/2002 | Cashman | 423/101 |
| 6,528,442 | B1 | 3/2003 | Kuwano et al. | |
| 2005/0084799 | A1 | 4/2005 | Yahagi et al. | |
| 2006/0147740 | A1 | 7/2006 | Hosono et al. | |
| 2007/0193413 | A9 * | 8/2007 | Harlamovs et al. | 75/721 |

FOREIGN PATENT DOCUMENTS

| JP | 03-050119 A | 3/1991 |
|---|---|---|
| JP | 2001-039713 A | 2/2001 |
| JP | 2003-192346 A | 7/2003 |

OTHER PUBLICATIONS

Toshihiko Matsumoto et al., "Electrical Property of Zinc Oxide", Nippon Daigaku Bunri Gakuba Shizen Kagaku Kenkyusho Kenkyu Kiyo, No. 16, pp. 5.21-5.26, Mar. 1981.
ESP@CENET Database, English Abstract of JP 07-118133, May 9, 1995.
ESP@CENET Database, English Abstract of JP 59-116339, Jul. 5, 1984.
ESP@CENET Database, English Abstract of JP 59-126729, Jul. 21, 1984.
ESP@CENET Database, English Abstract of JP 11-279755, Oct. 12, 1999.
ESP@CENET Database, English Abstract of JP 2003-013275, Jan. 15, 2003.
ESP@CENET Database, English Abstract of JP 05-017143, Jan. 26, 1993.
Unpublished Co-pending U.S. Appl. No. 12/282,933 (cited for consideration of Double Patenting Issues).
Unpublished Co-pending U.S. Appl. No. 12/094,024 (cited for consideration of Double Patenting Issues).
Unpublished Co-pending U.S. Appl. No. 11/994,025 (cited for consideration of Double Patenting Issues).
Unpublished Co-pending U.S. Appl. No. 11/933,944 (cited for consideration of Double Patenting Issues).

* cited by examiner

*Primary Examiner*—Wayne Langel
*Assistant Examiner*—James Fiorito
(74) *Attorney, Agent, or Firm*—Howson & Howson LLP

(57) ABSTRACT

Provided is a manufacturing method of high purity oxide powder including the steps of subjecting a raw material such as Zn-containing scrap to acid leaching or electrolytic extraction, thereafter performing solvent extraction and activated carbon treatment thereto in order to remove impurities, neutralizing the resultant solution freed of impurities with an alkaline solution to obtain zinc hydroxide, and firing the zinc hydroxide to obtain zinc oxide. Provided are high purity zinc oxide efficiently freed of impurities, in particular C, Cl, S and Pb impurities, at low cost and the manufacturing method thereof; a target manufactured by firing the high purity zinc oxide; and a high purity zinc oxide thin film obtained by the sputtering the target.

20 Claims, 1 Drawing Sheet

HIGH PURITY ZINC OXIDE POWDER AND METHOD FOR PRODUCTION THEREOF, AND HIGH PURITY ZINC OXIDE TARGET AND THIN FILM OF HIGH PURITY ZINC OXIDE

BACKGROUND OF THE INVENTION

The present invention pertains to high purity zinc oxide powder and the manufacturing method thereof, a sputtering target obtained by firing this high purity zinc oxide powder, and a high purity zinc oxide thin film formed by sputtering this target.

Zinc oxide (ZnO) is white-colored powder, also known as zinc flower or zinc white, and is powder having hexagonal crystals.

Zinc oxide is used as white pigment for paint and artists' colors, and is also used as pharmaceuticals or cosmetics. Further, in recent years, zinc oxide is being used as a sputtering target material for forming thin films to be used in electronic components such as a semiconductor device.

Commercially available zinc oxide has a purity level of 95 to 99.9 wt %, and it is necessary to purify this further to obtain a purity level of 4N to 5N. In particular, C, Cl and S must be sufficiently reduced since these respectively form carbide, chloride and sulfide together with Zn.

As conventional technology, there is a method of collecting Zn from Zn-containing dust, and, with this method, Zn-containing dust containing Fe and Pb is leached with sulfuric acid solution, and subject to solvent extraction with D2EHPA. With this technology, although there is an effect in the removal of Fe, there is a problem in that Pb, Si and Al cannot be sufficiently removed (e.g., refer to Patent Documents 1 and 2).

Further disclosed is a wet generation method of zinc oxide for directly generating zinc oxide in a solution by neutralizing an aqueous solution containing zinc salt in antalkali (refer to Patent Document 3). Nevertheless, there is no particular description regarding the removal of C, Cl, S and Pb, and it is also speculated that this is accepting the existence of C, Cl, S and Pb.

Meanwhile, since high purity zinc having a purity level of 6N exists, it is also possible to consider oxidizing this to obtain high purity zinc oxide. Nevertheless, since this will become extremely costly, it is not realistic for industrial manufacture.

[Patent Document 1]
Japanese Patent Laid-Open Publication No. S59-116339
[Patent Document 2]
Japanese Patent Laid-Open Publication No. S59-126729
[Patent Document 3]
Japanese Patent Laid-Open Publication No. S53-116296

SUMMARY OF THE INVENTION

Thus, an object of the present invention is to provide high purity zinc oxide and the manufacturing method thereof in which impurities, in particular C, Cl, S and Pb impurities, can be efficiently removed at low cost by subjecting Zn-containing raw material to acid leaching or electrolytic extraction, and thereafter subject this to solvent extraction and activated carbon treatment. Another object of the present invention is to provide a target obtained by firing this high purity zinc oxide, and a high purity zinc oxide thin film obtained by sputtering this target.

The present invention provides:
1. High purity zinc oxide powder, high purity zinc oxide sputtering target and high purity zinc oxide thin film wherein the impurity content excluding gas components of N, C, Cl, S and P is less than 100 wtppm;
2. High purity zinc oxide powder, high purity zinc oxide sputtering target and high purity zinc oxide thin film wherein the impurity content excluding gas components of N, C, Cl, S and P is less than 10 wtppm;
3. High purity zinc oxide powder, high purity zinc oxide sputtering target and high purity zinc oxide thin film according to paragraph 1 or paragraph 2 above, wherein the total content of gas components of C, Cl and S is less than 100 wtppm;
4. High purity zinc oxide powder, high purity zinc oxide sputtering target and high purity zinc oxide thin film according to any one paragraphs 1 to 3 above, wherein the Pb content as impurities is less than 5 wtppm;
5. High purity zinc oxide powder, high purity zinc oxide sputtering target and high purity zinc oxide thin film according to any one paragraphs 1 to 4 above, wherein Mg and Al are respectively less than 1 wtppm;
6. High purity zinc oxide sputtering target and high purity zinc oxide thin film according to any one paragraphs 1 to 5 above, wherein the crystal grain size of zinc oxide is 100 μm or less;
7. A manufacturing method of high purity zinc oxide powder including the steps of subjecting a raw material such as Zn-containing scrap to acid leaching or electrolytic extraction, thereafter performing solvent extraction and activated carbon treatment thereto in order to remove impurities, neutralizing the resultant solution freed of impurities with an alkaline solution to obtain zinc hydroxide, and firing the zinc hydroxide to obtain zinc oxide;
8. The manufacturing method of high purity zinc oxide powder according to any one of paragraphs 1 to 5 above, including the steps of subjecting a raw material such as Zn-containing scrap to acid leaching or electrolytic extraction, thereafter performing solvent extraction and activated carbon treatment thereto in order to remove impurities, neutralizing the resultant solution freed of impurities with an alkaline solution to obtain zinc hydroxide, and firing the zinc hydroxide to obtain zinc oxide; and
9. The manufacturing method of high purity zinc oxide powder according to paragraph 7 or paragraph 8 above, wherein the grain size of zinc oxide powder is 0.1 to 100 μm.

The present invention yields a superior effect in that high purity zinc oxide can be manufactured at low cost by dissolving a zinc-containing raw material having a purity level of 90 to 99.9 wt % with acid, and thereafter subjecting this to solvent extraction and activated carbon treatment in order to effectively remove impurities.

DETAILED DESCRIPTION OF THE INVENTION

Figure 1:
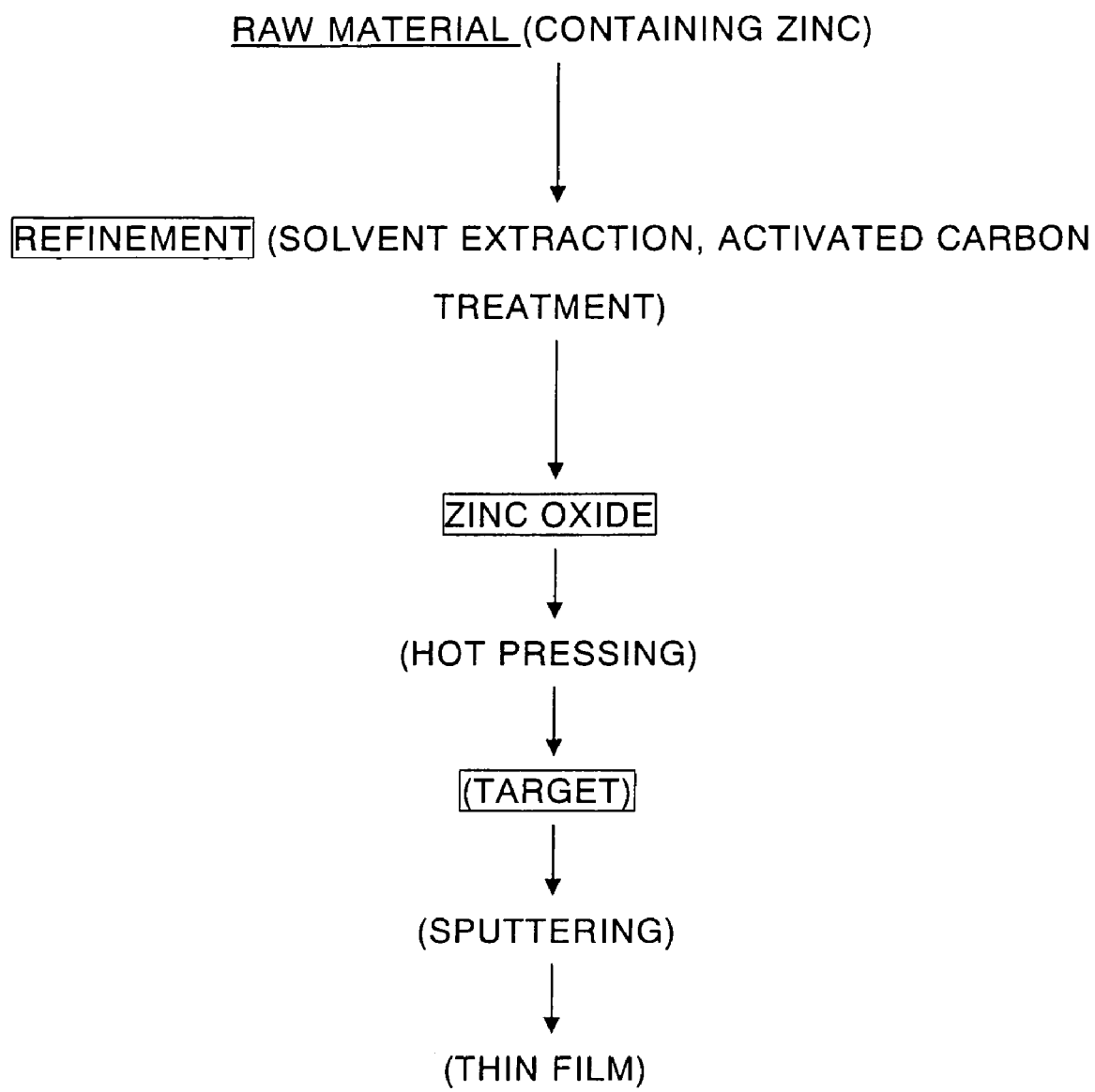
FIG. 1 is a flowchart showing the manufacturing method of high purity zinc oxide.

Examples of analytical values of the zinc-containing raw material are shown in Table 1. As shown in Table 1, this raw material contains Pb and Fe at 100wtppm or more; Cu, Cd, Th, Mg, Na, B and Li at roughly 10 to 80wtppm; impurities such as Ni, Co, Sn, Sb, W, Mo, Ga and Co respectively at roughly 1 to 10wtppm; and gas components of N, C, Cl, S and P at roughly 50wtppm to 3 wt %.

TABLE 1

| Impurities | Raw material | Example 1 | Example 2 | wtppm Example 3 |
|---|---|---|---|---|
| Pb | 100 | <0.1 | 0.2 | 0.5 |
| Fe | 115 | <0.1 | <0.1 | 0.3 |
| Cr | 8 | <0.1 | <0.1 | 0.1 |
| Ni | 6 | <0.1 | <0.1 | <0.1 |
| Cu | 10 | <0.1 | <0.1 | <0.1 |
| Al | 5 | 0.3 | <0.1 | <0.1 |
| Cd | 20 | 0.2 | <0.1 | <0.1 |
| Sn | 5 | 0.3 | <0.1 | <0.1 |
| Sb | 1 | <0.1 | <0.1 | <0.1 |
| W | 1 | <0.1 | <0.1 | <0.1 |
| Tl | 35 | 0.1 | 0.2 | 0.7 |
| Mo | 2 | <0.1 | <0.1 | <0.1 |
| Ga | 1 | <0.1 | <0.1 | <0.1 |
| Co | 3 | <0.1 | <0.1 | <0.1 |
| Mn | 1 | <0.1 | <0.1 | <0.1 |
| Ti | 4 | <0.1 | 0.3 | <0.1 |
| K | 5 | <0.1 | 0.3 | <0.1 |
| Mg | 13 | <0.1 | 0.2 | <0.1 |
| Na | 80 | <0.1 | 0.2 | <0.1 |
| B | 10 | <0.1 | 0.2 | <0.1 |
| Li | 50 | <0.1 | 0.2 | <0.1 |
| N | 2000 | 100 | 70 | 300 |
| C | 1% | 50 | 80 | 30 |
| Cl | 500 | 3 | 10 | 30 |
| S | 3% | 8 | 20 | 50 |
| P | 50 | <0.1 | <0.1 | <0.1 |
| Number of Particles | | 5 | 7 | 10 |

As described above, in particular, as a sputtering target or thin film to be used in electronic components such as a semiconductor device, high purity zinc oxide powder having a purity of 99.99 wt % or more is required. In particular, it is necessary to reduce impurities excluding gas components of N, C, Cl, S and P to be less than 100 wtppm since such impurities will have an adverse effect on the characteristics of ZnO. Preferably, the amount of impurities is less than 10 wtppm.

Gas components of C, Cl and S must be sufficiently reduced since these respectively form carbide, chloride and sulfide. It is desirable that these are less than 100 wtppm. Among the above, in particular, it is desirable that Cl is reduced as much as possible since it increases the leakage current when the TFT is turned off.

It is desirable that S is reduced as much as possible since it deteriorates the mobility due to the scattering of impurities. Further, C, Cl and S all cause the increase of particles during sputtering.

Further, it is desirable that the Pb content is less than 5 wtppm since Pb deteriorates the electrical mobility due to the scattering of impurities and has an adverse effect on ZnO. It is desirable that the Mg content and Al content are respectively less than 1wtppm since Mg and Al have stronger oxidizing power than Zn, deprive oxygen from ZnO, create oxygen loss, and further increase the leakage current when the TFT is turned off.

Upon manufacturing high purity zinc oxide powder, zinc-containing raw material is dissolved with acid at room temperature, and thereafter subject to solvent extraction and activated carbon treatment in order to remove impurities such as organic matter and foreign matter and impurities such as Pb described above. As the solvent, D2EHPA (D2 ethylhexyl phosphoric acid) may be used.

Upon performing acid dissolution, any acid capable of dissolving zinc may be used. As an example, acid leaching may be performed with nitric acid. Or zinc may be dissolved via electrolysis.

Thereafter, the resultant solution is neutralized with alkaline solution to obtain high purity zinc hydroxide ($Zn(OH)_2$). As the alkaline solution, in particular, it is desirable to use ammonium hydroxide. The use of sodium hydroxide or potassium hydroxide is undesirable since high concentrations of Na and K will be respectively mixed in the zinc oxide.

The zinc hydroxide obtained as described above is fired at 100 to 500° C. in order to obtain zinc oxide (ZnO) powder of 0.1 to 100 μm. As a result of the foregoing processing steps, it is possible to reduce various impurities, excluding gas components, to be 1 ppm or less or 0.1 ppm or less, and obtain high purity zinc oxide having a purity level of 5N or more. The flow of the manufacturing method of high purity zinc oxide according to the present invention is shown in FIG. 1.

This zinc oxide powder is further hot pressed and formed into a sputtering target. As an example of the hot pressing conditions, this may be performed under oxygen atmosphere at, for instance, 1200° C.×5 hr.

This target is further sputtered under oxygen atmosphere to obtain a high purity zinc oxide thin film.

EXAMPLES

Examples of the present invention are now explained. These Examples are merely illustrative, and the present invention shall in no way be limited thereby. In other words, the present invention shall only be limited by the scope of the present invention, and shall include the various modifications other than the Examples of this invention.

Example 1

100 g of raw material having a zinc content level of 90 wt % and containing the impurities shown in Table 1 was subject to acid leaching with 1 L of acid containing 10% nitric acid to obtain a solution having a zinc concentration of 90 g/L.

Next, the resultant solution was subject to solvent extraction with D2EHPA. This was further subject to activated carbon treatment in order to remove impurities such as organic matter and Pb. Thereafter, this was neutralized with $NH_4OH$ to obtain high purity zinc hydroxide ($Zn(OH)_2$).

The obtained high purity zinc hydroxide was fired at 200° C. to obtain high purity zinc oxide (ZnO) powder having an average grain size of 10 μm. The analysis of impurities of the high purity zinc oxide is shown in Table 1.

As shown in Table 1, the various impurities listed in Table 1, excluding gas components, were respectively reduced to 1 wtppm or less or 0.1 wtppm or less, and high purity zinc oxide powder having a purity level of 5N or more was obtained thereby. A significant improvement in purity was confirmed based on the processing steps shown in Example 1 of the present invention.

This high purity zinc oxide powder was used to manufacture a sputtering target by further performing hot pressing and sintering at 1200° C. for 5 hr under the flow volume of 5 ml/min of oxygen gas. This target was sputtered under oxygen atmosphere, and, in comparison to conventional targets, it was possible to form a high purity zinc oxide thin film on the substrate. As the level of particles on the thin film, there were 5 particles of 0.2 μm or larger.

The various impurities contained in the raw material are particularly disfavored in the manufacture of semiconductor devices and the like, and the reduction of these impurities is extremely effective.

Example 2

The same raw material as Example 1 was used, and electrolysis was performed with pH2 ammonium nitrate solution in order to extract Zn in the solution. Impurities were removed with the same method as Example 1. The impurities analysis and the like are similarly shown in Table 1.

Example 3

The same raw material as Example 1 was used, and electrolysis was performed with pH2 ammonium nitrate solution again in order to extract Zn in the solution. Impurities were removed with the same method as Example 1. The impurities analysis and the like are similarly shown in Table 1.

Comparative Example 1

100 g of raw material having a zinc content level of 90 wt % and containing the impurities as with Example 1 was subject to acid leaching with 1 L of acid containing 10% hydrochloric acid and 10% hydrogen peroxide to obtain a solution having a zinc concentration of 90 g/L.

$NH_4OH$ was added to this resultant solution and neutralized to pH8 in order to obtain zinc hydroxide ($Zn(OH)_2$).

This was further fired at 200° C. to obtain zinc oxide (ZnO) powder. The analysis of impurities of the obtained zinc oxide is shown in Table 2.

As shown in Table 2, most of the various impurities shown in Table 1 were hardly reduced.

Comparative Example 2

100 g of raw material having a zinc content level of 90 wt % and containing the impurities as with Example 1 was subject to acid leaching with 1 L of acid containing 10% hydrochloric acid and 10% hydrogen peroxide to obtain a solution having a zinc concentration of 90 g/L.

Next, the resultant solution was subject to solvent extraction with D2EHPA to remove impurities. Incidentally, the activated carbon treatment shown in Example 1 was not performed. $NH_4OH$ was added to this resultant solution and neutralized to pH8 in order to obtain zinc hydroxide ($Zn(OH)_2$).

This was further fired at 200° C. to obtain zinc oxide (ZnO) powder. The analysis of impurities of the obtained zinc oxide is shown in Table 2.

As shown in Table 2, although the purity improved in comparison to Comparative Example 1, impurities such as Pb, Tl, Na, Li, Na, Cl, S and P were contained in a considerable amount, and the effect of sufficiently removing impurities could not be realized. Therefore, it is evident that activated carbon treatment is important when compared with Example 1.

Comparative Example 3

100 g of raw material having a zinc content level of 90 wt % and containing the impurities as with Example 1 was subject to acid leaching with 1 L of acid containing 10% hydrochloric acid and 10% hydrogen peroxide to obtain a solution having a zinc concentration of 90 g/L.

Next, the resultant solution was subject to solvent extraction with D2EHPA. This was further subject to activated carbon treatment to remove impurities such as organic matter and Pb. Thereafter, this resultant solution was neutralized with NaOH in order to obtain high purity zinc hydroxide ($Zn(OH)_2$).

This was further fired at 200° C. to obtain high purity zinc oxide (ZnO) powder. The analysis of impurities of the obtained high purity zinc oxide is shown in Table 2.

As shown in Table 2, zinc oxide in which impurities excluding Na and K equal to Example 1 was obtained. In particular, the increase of Na is due to the neutralization with NaOH, and it is evident that the use of ammonia water as the neutralizing agent is important.

The present invention yields a superior effect in that high purity zinc oxide can be manufactured at low cost by dissolving a commercially available zinc-containing raw material having a purity level of 90 wt % with acid, and thereafter subjecting this to solvent extraction and activated carbon treatment in order to effectively remove impurities, and is extremely useful as a target material for electronic components such as a semiconductor device.

TABLE 2

| Impurities | Raw material | Comparative Example 1 | Comparative Example 2 | wtppm Comparative Example 3 |
|---|---|---|---|---|
| Pb | 100 | 80 | 20 | <0.1 |
| Fe | 115 | 74 | <0.1 | <0.1 |
| Cr | 8 | 2 | 1.7 | <0.1 |
| Ni | 6 | 5 | 4 | <0.1 |
| Cu | 10 | 2 | 1 | <0.1 |
| Al | 5 | 4 | 1 | 0.3 |
| Cd | 20 | 15 | 4 | 0.2 |
| Sn | 5 | 1 | 1 | 0.3 |
| Sb | 1 | <1 | <1 | <0.1 |
| W | 1 | <1 | <1 | <0.1 |
| Tl | 35 | 20 | 12 | 0.1 |
| Mo | 2 | 1 | <1 | <0.1 |
| Ga | 1 | <1 | <1 | <0.1 |
| Co | 3 | 1 | <1 | <0.1 |
| Mn | 1 | <1 | <1 | <0.1 |
| Ti | 4 | 2 | <1 | <0.1 |
| K | 5 | 3 | 2 | 0.5 |
| Mg | 13 | 10 | 7 | <0.1 |
| Na | 80 | 70 | 40 | 150 |
| B | 10 | 4 | 1 | <0.1 |
| Li | 50 | 40 | 15 | <0.1 |
| N | 2000 | 850 | 1% | 100 |
| C | 1% | 700 | 5% | 50 |
| Cl | 500 | 400 | 100 | 3 |
| S | 3% | 1% | 200 | 8 |
| P | 50 | 1 | 50 | <0.1 |
| Number of Particles | | 700 | 1000 | 250 |

The invention claimed is:

1. High purity zinc oxide powder having an impurity content excluding gas components of N, C, Cl, S and P of less than 10 wtppm, a total content of gas components of C, Cl and S of less than 100 wtppm, a content of Na of 1 wtppm or less, and a content of K of 1 wtppm or less.

2. High purity zinc oxide powder according to claim 1, wherein said powder has an impurity content of Pb of less than 5 wtppm.

3. High purity zinc oxide powder according to claim 2, wherein said powder has a content of Mg and Al of less than 1 wtppm, respectively.

4. High purity zinc oxide powder according to claim 1, wherein said powder has a content of Mg and Al of less than 1 wtppm, respectively.

5. A high purity zinc oxide powder according to claim 1, produced by a process comprising the steps of subjecting a raw material such as Zn-containing scrap to acid leaching or electrolytic extraction, thereafter performing solvent extraction and activated carbon treatment thereto in order to remove impurities, neutralizing the resultant solution freed of impurities with an alkaline solution to obtain zinc hydroxide, and firing the zinc hydroxide to obtain zinc oxide.

6. A manufacturing method of high purity zinc oxide powder including the steps of subjecting a raw material such as Zn-containing scrap to acid leaching with nitric acid or electrolytic extraction with ammonium nitrate solution, thereafter performing solvent extraction and activated carbon treatment thereto in order to remove impurities, neutralizing the resultant solution freed of impurities with ammonium hydroxide to obtain zinc hydroxide, and firing the zinc hydroxide to obtain zinc oxide.

7. A method according to claim 6, wherein the grain size of the zinc oxide powder produced by the method is 0.1 to 100 µm.

8. A method according to claim 6, wherein the zinc oxide powder produced by the method has an impurity content of N, C, Cl, S and P, excluding gas components, of less than 10 wtppm and a total content of gas components C, Cl and S of less than 100 wtppm.

9. A high purity zinc oxide sputtering target having an impurity content of N, C, Cl, S and P, excluding gas components, of less than 10 wtppm, a total content of gas components C, Cl and S of less than 100 wtppm, a content of Na of 1 wtppm or less, and a content of K of 1 wtppm or less.

10. A sputtering target according to claim 9, wherein said zinc oxide target has a crystal grain size of 100 µm or less.

11. A sputtering target according to claim 9, wherein said target has a content of Mg and Al of less than 1 wtppm, respectively.

12. A sputtering target according to claim 9, wherein said target has an impurity content of Pb of less than 5 wtppm.

13. A sputtering target according to claim 12, wherein said target has a content of Mg and Al of less than 1 wtppm, respectively.

14. A sputtering target according to claim 13, wherein said zinc oxide target has a crystal grain size of 100 µm or less.

15. A high purity zinc oxide thin film having an impurity content of N, C, Cl, S and P, excluding gas components, of less than 10 wtppm, a total content of gas components C, Cl and S of less than 100 wtppm, a content of Na of 1 wtppm or less, and a content of K of 1 wtppm or less.

16. A thin film according to claim 15, wherein said zinc oxide thin film has a crystal grain size of 100 µm or less.

17. A thin film according to claim 15, wherein said thin film has a content of Mg and Al of less than 1 wtppm, respectively.

18. A thin film according to claim 15, wherein said thin film has an impurity content of Pb of less Than 5 wtppm.

19. A thin film according to claim 18, wherein said thin film has a content of Mg and Al of less than 1 wtppm, respectively.

20. A thin film according to claim 19, wherein said zinc oxide thin film has a crystal grain size of 100 µm or less.

* * * * *